United States Patent
Liu et al.

(10) Patent No.: US 11,745,489 B2
(45) Date of Patent: Sep. 5, 2023

(54) LAMINATING APPARATUS, FLEXIBLE DISPLAY PANEL AND ASSEMBLING METHOD THEREOF, FLEXIBLE DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xingguo Liu, Beijing (CN); Wei Qing, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 424 days.

(21) Appl. No.: 17/056,376

(22) PCT Filed: Mar. 17, 2020

(86) PCT No.: PCT/CN2020/079762
§ 371 (c)(1),
(2) Date: Nov. 17, 2020

(87) PCT Pub. No.: WO2020/207212
PCT Pub. Date: Oct. 15, 2020

(65) Prior Publication Data
US 2021/0206154 A1 Jul. 8, 2021

(30) Foreign Application Priority Data
Apr. 12, 2019 (CN) .......................... 201910293989.2

(51) Int. Cl.
*B32B 37/10* (2006.01)
*B32B 3/04* (2006.01)
(Continued)

(52) U.S. Cl.
CPC ................ *B32B 37/10* (2013.01); *B32B 3/04* (2013.01); *B32B 37/1027* (2013.01);
(Continued)

(58) Field of Classification Search
CPC .............. B32B 37/0046; B32B 37/003; B32B 38/1866; B32B 2457/20; B32B 2457/202;
(Continued)

(56) References Cited

U.S. PATENT DOCUMENTS

2010/0208190 A1  8/2010  Yoshida
2016/0170245 A1  6/2016  Zhang et al.
(Continued)

FOREIGN PATENT DOCUMENTS

CN     1753160 A     3/2006
CN     101563643 A   10/2009
(Continued)

OTHER PUBLICATIONS

Office Action dated Aug. 27, 2020 from counterpart CN Patent Application No. 201910293989.2, 22 pages.

*Primary Examiner* — Carson Gross
(74) *Attorney, Agent, or Firm* — Procopio, Cory, Hargreaves & Savitch LLP

(57) ABSTRACT

A laminating apparatus for laminating an object to be laminated includes: a rigid substrate, and a jig provided on a side of the rigid substrate and in contact therewith. The jig is of an elastic material, and a surface of the jig away from the rigid substrate is a first surface. A horizontal plane at any point in a surface of the rigid substrate away from the jig is a first reference plane, and a contact interface between the (Continued)

rigid substrate and the jig is a second surface. For any one of the at least one segment of cambered surface, a distance between the second surface and the first reference plane increases as a non-obtuse angle between a tangent of the first surface and the horizontal direction increases.

15 Claims, 4 Drawing Sheets

(51) Int. Cl.
    *B32B 37/12*         (2006.01)
    *G09F 9/30*          (2006.01)
    *B32B 38/18*         (2006.01)
    *H10K 102/00*       (2023.01)

(52) U.S. Cl.
    CPC .......... *B32B 37/12* (2013.01); *B32B 38/1866* (2013.01); *B32B 2309/06* (2013.01); *B32B 2309/12* (2013.01); *B32B 2457/206* (2013.01); *G09F 9/301* (2013.01); *H10K 2102/311* (2023.02); *Y10T 156/1028* (2015.01)

(58) Field of Classification Search
    CPC ........ B32B 2457/204; B32B 2457/206; B32B 2457/208; Y10T 156/1028; H10K 2102/311
    See application file for complete search history.

(56) References Cited

U.S. PATENT DOCUMENTS

| | | |
|---|---|---|
| 2016/0351594 A1 | 12/2016 | Shangguan et al. |
| 2018/0250912 A1 | 9/2018 | Chen et al. |
| 2019/0039365 A1 | 2/2019 | Zheng et al. |
| 2019/0329540 A1* | 10/2019 | Kim .................... B32B 38/1866 |

FOREIGN PATENT DOCUMENTS

| | | | |
|---|---|---|---|
| CN | 102902109 A | | 1/2013 |
| CN | 104385757 A | | 3/2015 |
| CN | 104851364 A | | 8/2015 |
| CN | 106585045 A | | 4/2017 |
| CN | 107037923 A | | 8/2017 |
| CN | 107264867 A | | 10/2017 |
| CN | 107403862 A | | 11/2017 |
| CN | 108582897 A | | 9/2018 |
| CN | 109342573 A | | 2/2019 |
| CN | 109532193 A | | 3/2019 |
| CN | 109950184 A | | 6/2019 |
| JP | 2005322815 A | | 11/2005 |
| KR | 20150033969 A | * | 4/2015 |
| KR | 20150048547 A | | 5/2015 |
| KR | 20160102767 A | | 8/2016 |
| TW | M372058 U1 | | 1/2010 |

* cited by examiner

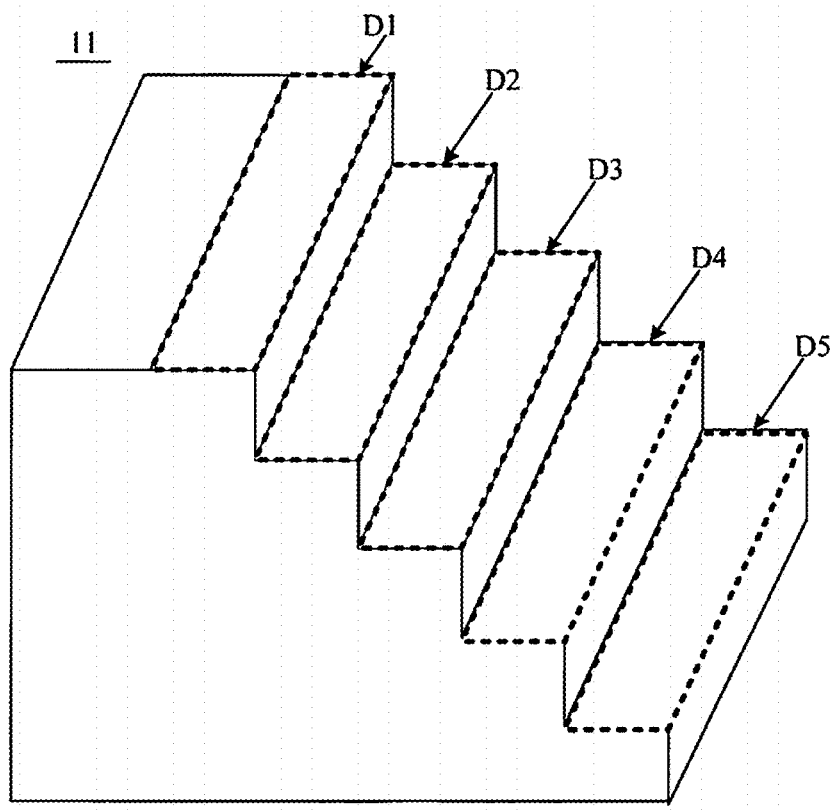

FIG. 8

Place an array substrate and a counter substrate aligned in cell, a transparent adhesive layer and a light-transmitting cover plate in sequence on a first surface of the laminating apparatus as described in any of the above embodiments. A surface of the array substrate away from the light-transmitting cover plate is in contact with and bonded to the first surface. ⟵ S11

↓

The laminating apparatus exerts a force on the array substrate and the counter substrate aligned in cell, the transparent adhesive layer, and the light-transmitting cover plate, until the array substrate and the counter substrate aligned in cell, the transparent adhesive layer, and the light-transmitting cover plate are laminated together. ⟵ S12

FIG. 9

LAMINATING APPARATUS, FLEXIBLE DISPLAY PANEL AND ASSEMBLING METHOD THEREOF, FLEXIBLE DISPLAY APPARATUS

CROSS-REFERENCE TO RELATED APPLICATIONS

This application is a national phase entry under 35 USC 371 of International Patent Application No. PCT/CN2020/079762 filed on Mar. 17, 2020, which claims priority to Chinese Patent Application No. 201910293989.2, filed on Apr. 12, 2019, titled "LAMINATING APPARATUS, FLEXIBLE DISPLAY PANEL AND ASSEMBLING METHOD THEREOF, FLEXIBLE DISPLAY APPARATUS", which are incorporated herein by reference in their entirety.

TECHNICAL FIELD

The embodiments of the present disclosure relate to a laminating apparatus, a flexible display panel and an assembling method thereof, and a flexible display apparatus.

BACKGROUND

Due to their low power consumption, high color saturation, wide viewing angle, small thickness and flexibility, Organic Electro luminescent Display (OLED) display apparatuses have gradually become the mainstream product in the display field, and can be widely used in smart phones, tablets, televisions and other terminal products.

SUMMARY

In an aspect, a laminating apparatus is provided. The laminating apparatus is used for laminating an object to be laminated. The laminating apparatus includes a rigid substrate, and a jig provided on a side of the rigid substrate and in contact therewith. The jig is of an elastic material, and a surface of the jig away from the rigid substrate is a first surface. The laminating apparatus has a bent section, and a portion of the first surface located in the bent section includes at least one segment of cambered surface; a non-obtuse angle between a tangent of any one of the at least one segment of cambered surface and a horizontal direction increases gradually from an end of the segment of cambered surface to an opposite end of the segment of cambered surface. A horizontal plane at any point in a surface of the rigid substrate away from the jig is a first reference plane, and a contact interface between the rigid substrate and the jig is a second surface. For any one of the at least one segment of cambered surface, a distance between the second surface and the first reference plane increases as a non-obtuse angle between a tangent of the first surface and the horizontal direction increases.

In some embodiments, a positive pressure Fi exerted by the laminating apparatus on the object to be laminated in a normal direction of the first surface satisfies following equation: Fi=fi • cosαi, in which fi represents a force exerted on the jig by the rigid substrate, and αi represents an angle between a direction in which the rigid substrate exerts the force on the jig and the normal direction of the first surface.

In some embodiments, for any one of the at least one segment of cambered surface, directions in which the rigid substrate exerts the force on the jig at various positions are the same.

In some embodiments, a portion of the second surface located in the bent section is in a shape of multiple steps; and a thickness of the jig corresponding to a step is $$Li = \frac{H \cdot E \cdot Di \cdot \cos \alpha i}{Fi}.$$

in which Fi represents a force exerted by the laminating apparatus on the object in the normal direction of the first surface, and meets 0.3 Mpa≤Fi≤0.9 Mpa; H represents a displacement of a surface of the object proximate to the jig relative to a surface of the object away from the jig; E represents an elastic modulus of the jig; Di represents an area of an orthographic projection of a surface of the step on a second reference plane, the surface of the step being perpendicular to the direction in which the rigid substrate exerts the force on the jig, and the second reference plane being perpendicular to the direction in which the rigid substrate exerts the force on the jig; and αi represents an angle between the direction in which the rigid substrate exerts the force on the jig and the normal direction of the first surface, and meets 0°≤αi≤90°.

In some embodiments, the laminating apparatus further has a non-bent section, and a portion of the first surface located in the non-bent section and a portion of the second surface located in the non-bent section are both flat surfaces parallel to the horizontal plane.

In some embodiments, the at least one segment of cambered surface includes a first segment of sub-cambered surface and a second segment of sub-cambered surface, the first segment of sub-cambered surface being mirror symmetrical to the second segment of sub-cambered surface. A flat surface in the first surface is disposed between the first segment of sub-cambered surface and the second segment of sub-cambered surface and is directly connected with the first segment of sub-cambered surface and the second segment of sub-cambered surface respectively. An intersection line of the first segment of sub-cambered surface and the flat surface is a first intersection line, and a non-obtuse angle between a tangent of the first segment of sub-cambered surface and the horizontal direction increases gradually from the first intersection line to an end of the first segment of sub-cambered surface opposite to the first intersection line.

In some embodiments, a thickness of a portion of the jig located in the non-bent section is greater than a thickness of a portion of the jig located in the bent section.

In some embodiments, a hardness of the portion of the jig located in the non-bent section is less than a hardness of the portion of the jig located in the bent section.

In some embodiments, the jig bulges from a side thereof away from the rigid substrate.

In some embodiments, the first surface is arch-shaped.

In some embodiments, the direction in which the rigid substrate exerts the force on the jig is a vertical direction.

In some embodiments, the surface of the rigid substrate away from the jig is flat.

In some embodiments, the elastic material of the jig includes a hyperelastic material.

In some embodiments, the jig is of at least one of silicone or rubber.

In some embodiments, the rigid substrate is of at least one of glass or metal.

In another aspect, an assembling method of a flexible display panel is provided.

The assembling method includes: placing an array substrate and a counter substrate aligned in cell, a transparent adhesive layer and a light-transmitting cover plate in sequence on a first surface of the laminating apparatus according to any one of the above embodiments, a surface of the array substrate away from the light-transmitting cover plate being in contact with and bonded to the first surface; and exerting, by the laminating apparatus, a force on the array substrate and the counter substrate aligned in cell, the transparent adhesive layer, and the light-transmitting cover plate, until the array substrate and the counter substrate aligned in cell, the transparent adhesive layer, and the light-transmitting cover plate are laminated together.

In yet another aspect, a flexible display panel is provided. The flexible display panel is manufactured by the assembling method of the flexible display panel as described in the above embodiment.

In yet another aspect, a flexible display apparatus is provided. The flexible display apparatus includes the flexible display panel as described in the above embodiment.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on an actual size of a product, an actual process of a method and an actual timing of a signal to which the embodiments of the present disclosure relate.

FIG. 8 is a structural diagram of a rigid substrate, according to some embodiments of the present disclosure; and FIG. 9 is a flow chart for assembling a flexible display panel, according to some embodiments of the present disclosure.

DETAILED DESCRIPTION

Technical solutions in some embodiments of the present disclosure will be described below clearly and completely in combination with accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" in the description and the claims are construed as open and inclusive, i.e., "including, but not limited to". In the description, terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials or characteristics may be included in any one or more embodiments or examples in any suitable manner.

Hereinafter, the terms such as "first" and "second" are used for descriptive purposes only, and are not to be construed as indicating or implying a relative importance or implicitly indicating the number of indicated technical features below. Thus, features defined with "first" and "second" may explicitly or implicitly include one or more of the features. In the description of the embodiments of the present disclosure, the term "a plurality of/the plurality of" means two or more unless otherwise specified.

The phrase "at least one of A, B, and C" has a same meaning as the phrase "at least one of A, B, or C", and both include the following combinations of A, B, and C: only A, only B, only C, a combination of A and B, a combination of A and C, a combination of B and C, and a combination of A, B, and C.

The phrase "A and/or B" includes the following three combinations: only A, only B, and a combination of A and B.

Flexible display apparatuses can be used in mobile phones, tablet computers, personal digital assistants (PDAs), vehicle computers, etc., which is not limited in embodiments of the present disclosure.

Figure 1:
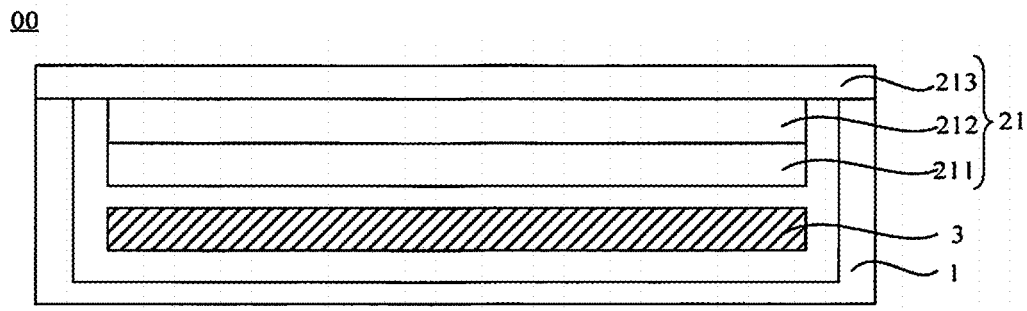
FIG. 1 is a structural diagram of an OLED display apparatus, according to some embodiments of the present disclosure.

As shown in FIG. 1, in an example where a flexible display apparatus is a top-emission OLED display 00, the OLED display apparatus 00 may for example include a frame 1, an OLED display panel 21, and a circuit board 3. Moreover, in some examples, the OLED display apparatus 00 may also include other electronic components such as camera(s), so that the OLED display apparatus can perform other functions such as taking pictures and film videos.

With continued reference to FIG. 1, the OLED display panel 21 in the OLED display apparatus 00 includes an array substrate 211, an encapsulation layer 212, and a glass cover plate 213 disposed on a side of the encapsulation layer 212 away from the array substrate 211. The array substrate 211, the encapsulation layer 212, the circuit board 3, and other electronic components such as camera(s) can be arranged in the frame 1. The frame 1 includes a bottom wall and side walls connected with the bottom wall, and the frame 1 has an open top. For example, the frame 1 is U-shaped. In this case, the circuit board 3 may be arranged between the OLED display panel 21 and the bottom wall of the frame 1.

Figure 2:
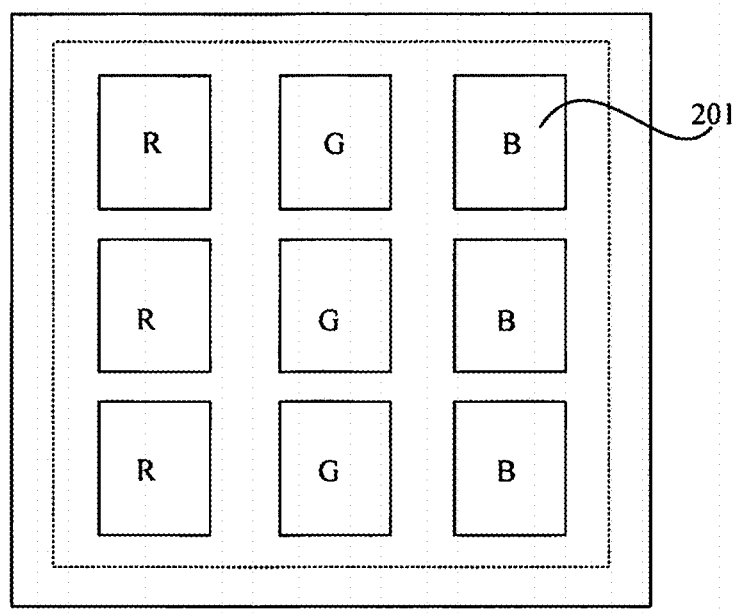
FIG. 2 is a top view of an array substrate, according to some embodiments of the present disclosure.
Figure 3:
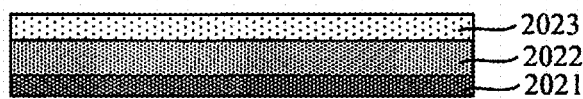
FIG. 3 is a structural diagram of an OLED apparatus, according to some embodiments of the present disclosure.

Referring to FIGS. 2 and 3, the array substrate 211 includes multiple sub-pixel areas 201, and includes an OLED apparatus 202 located in each sub-pixel area 201. The encapsulation layer 212 is used for encapsulating all OLED apparatuses 202 provided on the array substrate 211. As shown in FIG. 3, the OLED apparatus 202 includes a first electrode 2021, a light-emitting functional layer 2022 and a second electrode 2023 arranged sequentially on a substrate. The first electrode 2021 is an anode and the second electrode 2023 is a cathode; or, the first electrode 2021 is a cathode and the second electrode 2023 is an anode. On this basis, the array substrate 211 further includes a driving circuit for driving the OLED apparatus. During display, a voltage applied to the anode and the cathode is controlled by the driving circuit, holes are injected using the anode, and electrons are injected using the cathode. The formed electrons and holes meet in the light-emitting functional layer 2022 to produce excitons, which excite the light-emitting functional layer 2022 to emit light.

Herein, as shown in FIG. 2, the multiple sub-pixel areas 201 include red sub-pixel areas, green sub-pixel areas, and blue sub-pixel areas; or, the multiple sub-pixel areas 201 include magenta sub-pixel areas, yellow sub-pixel areas, and cyan sub-pixel areas. On this basis, the multiple sub-pixel areas 201 may also include white sub-pixel areas. For example, as shown in FIG. 2, the multiple sub-pixel areas 201 are arranged in a matrix. It will be noted that, only a part of the multiple sub-pixel areas 201 are shown in FIG. 2 for illustration. In practical applications, the more the sub-pixel areas 201, the higher a resolution of the OLED display panel. Therefore, the number of the sub-pixel areas 201 may be set according to a desired resolution of the OLED display panel.

Figure 4:
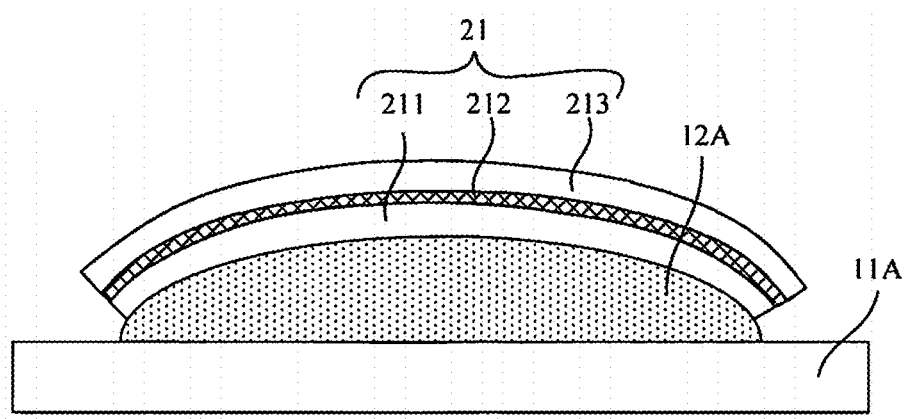
FIG. 4 is a structural diagram of a laminating apparatus and a flexible display panel, according to the related art.

In the related art, as shown in FIG. 4, the OLED display panel 21 includes an array substrate 211, an encapsulation layer 212, and a glass cover plate 213 disposed on a side of the encapsulation layer 212 away from the array substrate 211. For a flexible OLED display apparatus, the OLED display panel 21 may be made into a curved or other shape. With a curved OLED display panel 21 as an example, the encapsulated array substrate 211 and the encapsulation layer 212 need to be fixed with the glass cover plate 213 by a laminating apparatus.

However, as shown in FIG. 4, the laminating apparatus in the related art include a rigid substrate 11A and a jig 12A, and a contact interface between the rigid substrate 11A and the jig 12A is a flat surface parallel to a horizontal direction. The inventor of the present disclosure has discovered through research that when the laminating apparatuses in the related art are used to exert a force on the encapsulated array substrate 211, the encapsulation layer 212 and a curved glass cover plate 213 to laminate the encapsulated array substrate 211, the encapsulated layer 212 and the curved glass cover plate 22, since a surface of the encapsulated array substrate 211 that is in contact with the jig 12A is a curved surface and angles between tangents at various positions on the curved surface and the horizontal direction are different, a positive pressure on the curved OLED display panel 21 is unevenly distributed at different positions. For example, if the positive pressure on the curved OLED display panel 21 is too large, cracks may occur; and if the positive pressure on the curved OLED display panel 21 is too small, the curved OLED display panel 21 may not be firmly laminated with the glass cover panel 22.

On this basis, some embodiments of this present disclosure provide a laminating apparatus 10, which can be used for laminating the encapsulated array substrate 211, the encapsulation layer 212, and the glass cover plate 213. Of course, the laminating apparatus may also be used to laminate other flexible objects to be laminated, which is not limited in the embodiments of this present disclosure.

Figure 5:
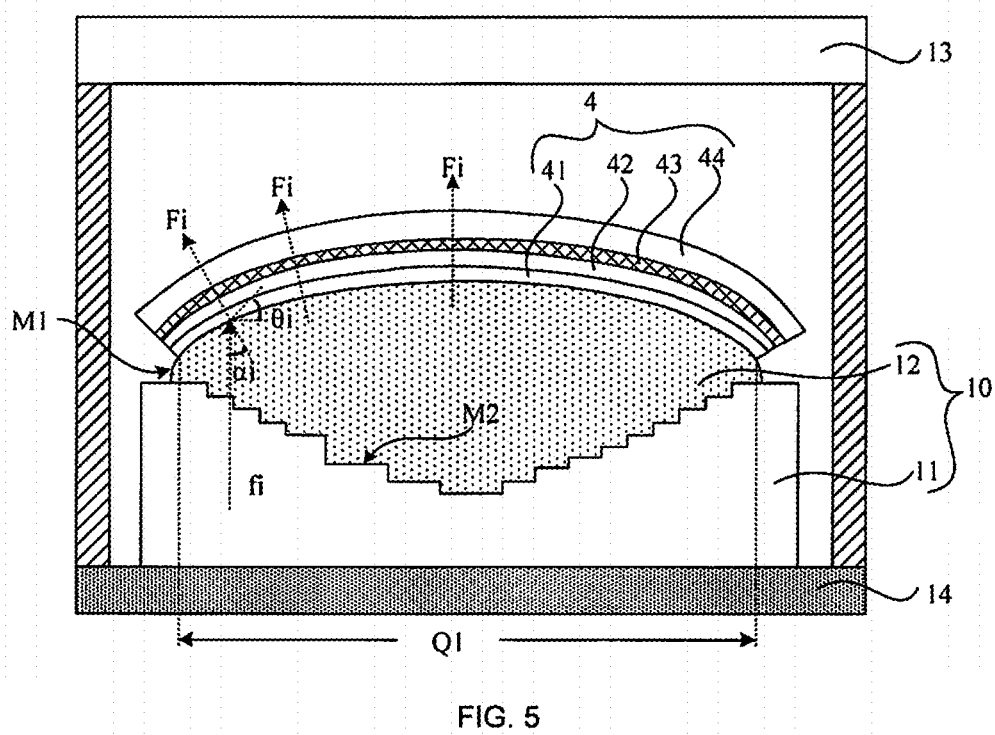
FIG. 5 is a structural diagram of a laminating apparatus and a flexible display panel, according to some embodiments of the present disclosure.
Figure 6:
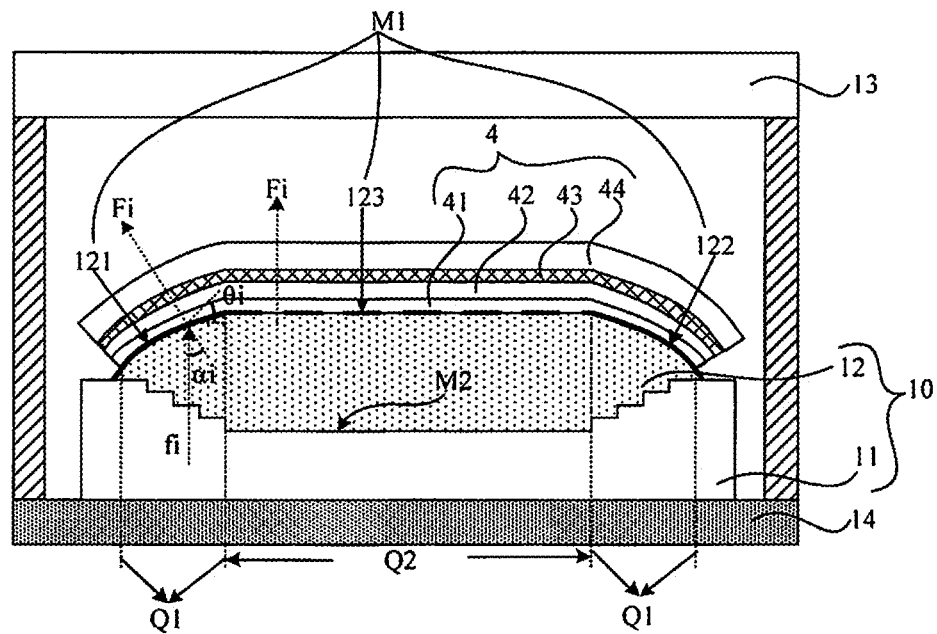
FIG. 6 is a structural diagram of another laminating apparatus and a flexible display panel, according to some embodiments of the present disclosure.
Figure 7:
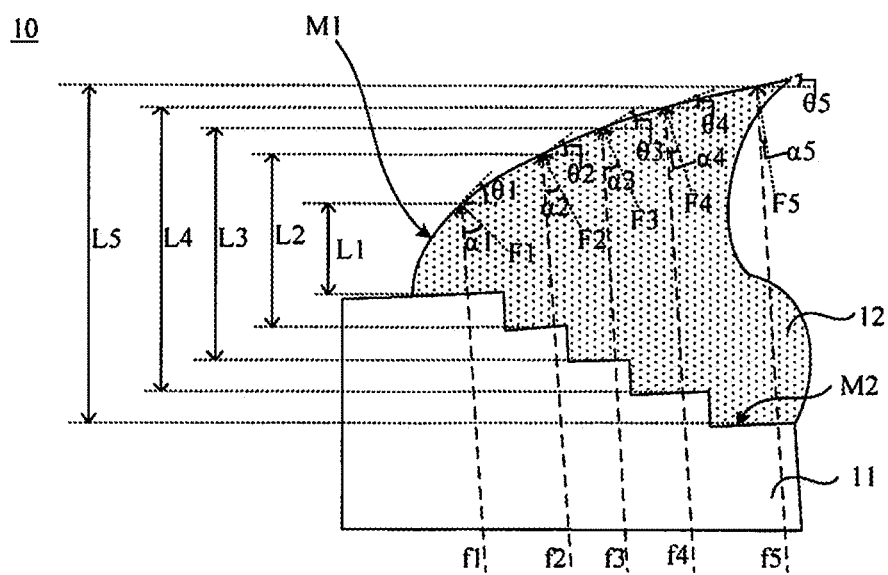
FIG. 7 is a force analysis diagram of a laminating apparatus, according to some embodiments of the present disclosure.

As shown in FIGS. 5 and 6, the laminating apparatus 10 is used to laminate the object 4 to be laminated, and the laminating apparatus 10 includes a rigid substrate 11 and a jig 12 disposed on the rigid substrate 11 and in contact with the rigid substrate. The jig 12 is of an elastic material, and a surface of the jig 12 away from the rigid substrate 11 is a first surface M1. As shown in FIG. 7, the laminating apparatus 10 is used to adjust a force fi (f1~f5 in FIG. 7) exerted by the rigid substrate 11 on the jig 12 according to an angle αi (α1~α5 in FIG. 7) between a direction in which the rigid substrate 11 exerts the force on the jig 12 and a normal direction of the first surface M1, so as to adjust a magnitude of a positive pressure Fi (F1~F5 in FIG. 7) exerted by the jig 12 on the object 4 to be laminated in the normal direction of the first surface M1.

For example, according to the equation Fi=fi • cosαi, the positive pressure Fi exerted on the object 4 to be laminated along the normal direction of the first surface M1 can be adjusted.

For example, based on the above, as shown in FIGS. 5 and 6, the laminating apparatus 10 may further includes a hydraulic column 14 provided on a side of the rigid substrate 11 away from the jig 12, and a fixed plate 13 provided on a side of the jig 12 away from the rigid substrate 11. There is a space between the fixed plate 13 and the jig 12, and the space is at least greater than a thickness of the object 4 to be laminated before it is laminated, so that the object 4 can be placed between the fixed plate 13 and the jig 12 before lamination.

The hydraulic column 14 can exert a pressure on the rigid substrate 11, thus causing the rigid substrate 11 to exert a force fi on the jig 12. Finally, the jig 12 exerts a component force Fi of the force fi in the normal direction of the first surface on the object 4. It will be noted that, in a case where a contact interface between the jig 12 and the rigid substrate 11 is perpendicular to a direction of the pressure exerted by the hydraulic column 14 on the rigid substrate 11, the force fi exerted by the rigid substrate 11 on the jig 12 is equal to the pressure exerted by the hydraulic column 14 on the rigid substrate 11.

In a case where an angle between the contact interface of the jig 12 and the rigid substrate 11 and the direction of the pressure exerted by the hydraulic column 14 on the rigid substrate 11 is an acute angle, the force fi exerted by the rigid substrate 11 on the jig 12 is equal to a component of the pressure exerted by hydraulic column 14 on the rigid substrate 11 in a direction perpendicular to the contact interface. On this basis, in a case where the pressure exerted by the hydraulic column 14 on the rigid substrate 11 is constant, the force fi exerted by the rigid substrate 11 on the jig 12 can be adjusted by adjusting a magnitude of the acute angle between the contact interface of the jig 12 and the rigid substrate 11 and the direction of the pressure exerted by the hydraulic column 14 on the rigid substrate 11. That is, the greater the acute angle, the smaller the force fi exerted by the rigid substrate 11 on the jig 12.

For example, the elastic material of the jig 12 includes a hyperelastic material. The hyperelastic material produces a larger amount of strain than an ordinary elastic material under a same external force, and a deformation can be restored to an original state after the external force is removed. Therefore, in a case where the jig includes a hyperelastic material, the object to be laminated can be better protected, and cracks are not easy to occur. Meanwhile, the jig 12 will not be plastically deformed due to an excessive pressure. In addition, a type of the hyperelastic material is not limited in the embodiments of this present disclosure. For example, the hyperelastic material may be at least one of rubber and silicone.

It will be noted that the material of the rigid substrate 11 is not limited in embodiments in this present disclosure, as long as a hardness of the rigid substrate 11 is sufficient to support the jig 12 and the object to be laminated. For example, the rigid substrate 11 is of at least one of glass or metal. The glass can be polymethyl methacrylate (PMMA), which is commonly known as acrylic. PMMA has good transparency, mechanical stability and weather resistance, and is easy to process.

In addition, a specific structure and purpose of the object to be laminated are not limited in the embodiments of this disclosure. Those skilled in the art will understand that lamination can be performed by applying a pressure to fix at least two structures together in a vacuum environment. Therefore, the object to be laminated in the embodiments of the present disclosure includes at least two structures.

For example, as shown in FIGS. 5 and 6, the object 4 to be laminated includes a light-transmitting cover plate 44, and an flexible array substrate 41 and a counter substrate 42 that are aligned in cell (herein, the flexible array substrate 41 and the counter substrate 42 are an integral structure).

Of course, the object 4 to be laminated may also be of other structures, which is not limited in the embodiments of the present disclosure.

It will be noted that the first surface can be of any shape. For example, the first surface M1 may be a surface parallel to the horizontal plane, a surface with an angle to the horizontal plane, a cambered surface or a curved surface.

As shown in FIG. 7, the rigid substrate 11 can exert a force fi on the jig 12 in any direction, as long as the laminating apparatus 10 can cause the object to be laminated to move in a direction from the rigid substrate 11 toward the jig 12. That is, the force fi exerted by the rigid substrate 11 on the jig 12 can be divided into Fi and a component perpendicular to Fi. In a case where the force fi exerted by the rigid substrate 11 on the jig 12 is parallel to a positive pressure Fi on the object, the positive pressure Fi on the object is equal to the force fi exerted by the rigid substrate 11 on the jig 12, and the component perpendicular to the positive pressure Fi is 0.

Herein, a direction of the component of the force fi perpendicular to the positive pressure Fi is not any direction from the jig 12 toward the rigid substrate 11. Otherwise, there will be a force exerted by the jig 12 on the rigid substrate 11 in any direction from the jig toward the rigid substrate 11, which is contrary to an original intention of the embodiments of the present disclosure.

On this basis, the angle αi between a direction of the force fi exerted by the laminating apparatus on the object to be laminated and the normal direction of the first surface should be an acute angle or 0°.

Herein, optionally, as shown in FIGS. 5 and 6, the rigid substrate 11 exerts the force fi on the jig 12 in a vertical direction. In this case, the angle αi between the direction in which the rigid substrate 11 exerts the force on the jig 12 and the normal direction of the first surface is equal to an angle θi between a tangential direction of the first surface and the horizontal direction.

Those skilled in the art will understand that the vertical direction is for the laminating apparatus to laminate the object.

For example, if the laminating apparatus laminates the object in an upward direction, then the vertical direction is a vertical upward direction in which the rigid substrate 11 exerts the force fi on the jig 12; and if the laminating apparatus laminates the object in a downward direction, then the vertical direction is a vertical downward direction in which the rigid substrate 11 exerts the force fi on the jig 12.

It will be noted that, the embodiments of this present disclosure do not limit a manner in which the force fi exerted by the rigid substrate 11 on the jig 12 is adjusted according to the angle αi between the direction in which the rigid substrate 11 exerts the force fi on the jig 12 and the normal direction of the first surface, so as to finally adjust the magnitude of the positive pressure Fi exerted by the jig 12 on the object in the normal direction of the first surface.

For example, the laminating apparatus 10 includes multiple hydraulic columns 14. The multiple hydraulic columns 14 can be used to exert different pressures on different positions of the rigid substrate 11 according to the angle αi between the direction in which the rigid substrate 11 exerts the force fi on the jig 12 and the normal direction of the first surface, so that the rigid substrate 11 can exert different forces fi (for example, f1~f5 in FIG. 7) on different positions of the jig 12, and eventually, the jig 12 exerts a component force Fi of the force fi on the object to be laminated in the normal direction of the first surface M1 to adjust the magnitude of the positive pressure Fi exerted by the jig 12 on the object in the normal direction of the first surface M1.

The magnitude of the positive pressure Fi eventually exerted by the laminating apparatus on the object in the normal direction of the first surface is not limited in the embodiments of this present disclosure. The magnitude of the positive pressure Fi is related to the object to be laminated: it needs to be ensured that not only the object is firmly laminated, but also the object will not crack due to an excessive positive pressure Fi.

In addition, the inventor has discovered through research that in a case where the jig 12 is made of silicone, a hardness and a stiffness coefficient of the jig can be adjusted. That is, the stiffness coefficient of the jig 12 at different positions varies as its thickness varies. The greater the thickness of the jig 12, the smaller the stiffness coefficient of the silicone and the smaller the hardness of the jig 12. Conversely, the smaller the thickness of the jig 12, the greater the hardness of the jig 12. The positive pressure exerted by the laminating apparatus on the curved OLED display panel 21 is related to the stiffness coefficient of the jig 12.

On this basis, some embodiments of this present disclosure provide a laminating apparatus 10. As shown in FIGS. 6 and 7, the laminating apparatus 10 includes a rigid substrate 11 and a jig 12 disposed on the rigid substrate 11. In a case where the jig 12 is of an elastic material (such as a hyperelastic material), a force fi exerted by the rigid substrate 11 on the jig 12 is adjusted according to an angle αi between a direction in which the rigid substrate 11 exerts the force on the jig 12 and a normal direction of a first surface M1, so as to adjust a magnitude of a positive pressure Fi exerted by the jig 12 on the object 4 to be laminated in the normal direction of the first surface M1.

For example, as shown in FIGS. 5~7, the laminating apparatus 10 has a bent section Q1, and a portion of the first surface M1 located in the bent section Q1 includes at least one segment of cambered surface (a portion of the first surface M1 as shown in FIG. 7), and a non-obtuse angle θi (θ1~θ5 as shown in FIG. 7) between a tangent of any one of the at least one segment of cambered surface and a horizontal direction increases gradually from an end of the segment of cambered surface to an opposite end of the segment of the cambered surface. A horizontal plane at any point in a surface of the rigid substrate away from the jig 12 is a first reference plane, and a contact interface between the rigid substrate 11 and the jig 12 is a second surface M2. For any one of the at least one segment of cambered surface, a distance between the second surface M2 and the first reference plane increases as a non-obtuse angle θi between a tangent of the first surface M1 and the horizontal direction increases. With this design, it may be possible to ensure that the positive pressure Fi received by the object 4 to be laminated at various positions thereof is within an acceptable range, so as to prevent the object 4 to be laminated from cracking during lamination due to an excessive positive pressure; and/or, to avoid a problem that the object is not firmly laminated due to bubbles caused by an insufficient positive pressure exerted by the laminating apparatus 10 on the object. In this way, it may be possible to solve a problem in related art that the laminating apparatus 10 cannot uniformly exert a positive pressure on the object to be laminated in the case where the jig 12 is made of an elastic material.

Since the second surface M2 is in direct contact with the jig 12, a surface of the jig 12 proximate to the rigid substrate 11 is completely bonded to the second surface M2 and their shapes are a complete match.

It will be noted that a surface of the rigid substrate 11 facing away from the jig 12 may be flat; or, the surface of the rigid substrate 11 facing away from the jig 12 may be uneven.

Furthermore, the surface of the rigid substrate 11 facing away from the jig 12 may be parallel to the horizontal direction or at an angle with the horizontal direction. The embodiments of the present disclosure do not impose any special restrictions on the surface of the rigid substrate 11 facing away from the jig 12.

For example, the embodiments of the present disclosure are described by taking an example in which the surface of the rigid substrate 11 facing away from the jig 12 is a flat surface parallel to the horizontal direction.

For example, for any segment of cambered surface, directions in which the rigid substrate 11 exerts the force fi on the jig 12 at various positions are the same.

For example, as shown in FIG. 5, the first surface of the jig 12 only includes cambered surface(s); or, as shown in FIG. 6, the first surface of the jig 12 includes both cambered surface(s) and flat surface(s).

In a case where the first surface of the jig 12 only includes cambered surface(s), as shown in FIG. 4, the first surface of the jig 12 may only include a segment of cambered surface, and from an end of the segment of cambered surface to an opposite end of the segment of cambered surface, an angle between a tangent of the segment of cambered surface and the horizontal direction decreases gradually first and then increases gradually; or, the first surface of the jig 12 may include multiple segments of cambered surfaces. For example, the first surface of the jig 12 is wavy.

In a case where the first surface of the jig 12 includes cambered surface(s), an angle between a tangent of the first surface and the horizontal direction may be an acute angle or an obtuse angle, and the angle between the tangent of the first surface and the horizontal direction may be 0° or 90°.

In a case where the first surface includes a flat surface parallel to the first reference plane, an angle between the flat surface and the horizontal direction is 0°.

In the embodiments of the present disclosure, a non-obtuse angle θi between the tangent of the first surface and the horizontal direction includes an acute angle or 0° or 90, as described above.

As for the embodiments of the present disclosure, as shown in FIG. 7, if the positive pressures exerted on the object to be laminated by the laminating apparatus 10 in a normal direction of the first surface M1 at various positions are Fi, and an angle between the direction in which the force fi is exerted on the jig 12 by the rigid substrate 11 and the normal direction of the first surface M1 is αi, then the force fi exerted by the rigid substrate 11 on the jig 12 may be expressed as:

$$fi = \frac{Fi}{\cos \alpha i} \rightarrow \text{Equation 1.}$$

Here, it is known that during lamination, a displacement of a surface of the object proximate to the jig 12 relative to a surface of the object away from the jig 12 is H, then a relationship between the force fi exerted by the rigid substrate 11 on the jig 12 and a stiffness coefficient Ki at a position on the jig 12 can be obtained as:

fi=Ki·H→Equation2, in which the stiffness coefficient Ki is a variable, and the force fi exerted by the rigid substrate 11 on the jig 12 is proportional to the stiffness coefficient Ki. It will be noted that, as shown in FIG. 7, in the bent section Q1, a distance between the first surface M1 and the second surface M2 is variable. In this case, fi can be equal to d (fi); d (fi) represents a differentiation of a function corresponding to fi at a corresponding step, for example, it can be approximately equal to an average force exerted on jig 12 at the step; Ki can be equal to d (Ki); and d (Ki) represents a differentiation of a function corresponding to Ki at the corresponding step, for example, it can be approximately equal to an average stiffness coefficient of a portion of the jig 12 corresponding to the step.

Based on the above, from Equations 1 and 2, it can be obtained that:

$$Fi = Ki \cdot H \cdot \cos \alpha i \rightarrow \quad \text{Equation 3.}$$

The normal direction of the first surface M1 and the non-obtuse angle θi between a tangent direction of the first surface M1 and the horizontal direction are constant, in a case where the directions in which the rigid substrate 11 exerts the force fi on the jig 12 at various positions are the same, the angle αi between the force fi exerted by the laminating apparatus on the object and the normal direction of the first surface M1 increases as the non-obtuse angle θi between the tangent direction of the first surface M1 and the horizontal direction increases.

On this basis, in a case where the displacement H of the surface of the object proximate to the jig 12 relative to the surface of the object away from the jig 12, and the positive pressure Fi exerted on the object are constant, the greater the non-obtuse angle θi between the tangent of the first surface and the horizontal direction, the greater the angle αi between the force fi exerted by the rigid substrate 11 on the jig 12 and the normal direction of the first surface; the smaller the value of cosαi, the greater the stiffness coefficient Ki.

Those skilled in the art will be aware that for an elastic material (such as a hyperelastic material), the greater the thickness, the smaller the stiffness coefficient. Thus, in the embodiments of the present disclosure, by increasing the non-obtuse angle θi between the tangent of the first surface and the horizontal direction, the distance between the second surface and the first reference plane may be increased (that is, the thickness of the jig is reduced), and the stiffness coefficient Ki of the jig 12 may be increased. In this way, the positive pressures Fi on the object at various positions can be adjusted, and the positive pressures Fi on the object at different positions may be more even.

If the first surface includes flat surface(s), the angle between the tangent direction of the flat surface(s) and the horizontal direction is 0°. In this case, the positive pressure Fi on the object is equal to the force fi exerted by the laminating apparatus on the object.

It is understandable that those skilled in the art will be aware that when a laminating apparatus is used to laminate the object, the first surface of the jig 12 of the laminating apparatus is in direct contact with the object to be laminated, and the surface of the object that is in contact with the jig 12 is completely bonded to the first surface. Therefore, the positive pressure Fi on the object is a force exerted by the laminating apparatus on the object in the normal direction of the first surface.

In addition, during lamination, once the surface of the object proximate to the jig 12 is in direct contact with the first surface and the surface of the object away from the jig 12 is in contact with the fixed plate 13, the surface of the object away from the jig 12 will stop moving. As the jig 12 moves, the surface of the object proximate to the jig 12 displaces in a direction from the rigid substrate 11 toward the jig 12. Therefore, the surface of the object proximate to the jig 12 has a displacement H relative to the surface of the object away from the jig 12. A direction of the displacement H of the surface of the object proximate to the jig 12 relative to the surface of the object away from the jig 12 is the same as the direction in which the jig 12 exerts the positive pressure Fi on the object.

In the embodiments of the present disclosure, for any segment of cambered surface, in a case where the directions in which the rigid substrate 11 exerts the force fi on the jig 12 at various positions are the same, it can be arranged that the distance between the second surface and the first reference plane increases as the non-obtuse angle $\theta i$ between the tangent of the first surface and the horizontal direction increases, so as to change the thicknesses of the jig 12 at different positions and thus change the stiffness coefficients of the jig 12 at the different positions.

For example, as shown in FIGS. 5~7, in the bent section, the second surface is in a shape of multiple steps; and a thickness of the jig 12 corresponding to a step is $$Li = \frac{H \cdot E \cdot Di \cdot \cos \alpha i}{Fi},$$

in which Fi represents a force exerted by the jig 12 on the object 4 in the normal direction of the first surface M1 and meets 0.3 Mpa≤Fi≤0.9 Mpa; H represents the displacement of the surface of the object proximate to the jig 12 relative to the surface of the object away from the jig 12; E represents an elastic modulus of the jig 12; Di (D1~D5 in FIG. 8) represents an area of an orthographic projection of a surface of the step on the second reference plane, the surface of the step being perpendicular to the direction in which the rigid substrate 11 exerts the force on the jig 12, and the second reference plane being perpendicular to the direction in which the rigid substrate 11 exerts the force on the jig 12; and $\alpha i$ represents the angle between the direction in which the rigid substrate 11 exerts the force on the jig 12 and the normal direction of first surface M1, and meets 0°≤$\alpha i$≤90°.

For any segment of cambered surface, the directions in which the rigid substrate 11 exerts the force fi on the jig 12 at various positions are the same. Therefore, for any segment of cambered surface, the second reference plane is unique and certain, and angles between surfaces of steps corresponding to the segment of cambered surface and the horizontal direction are always the same.

Here, an elastic modulus E of the hyperelastic material and the area Di of the orthographic projection of the surface of the step on the second reference plane are already known, then a relationship between the thickness Li (L1~L5 in FIG. 7) of the jig 12 at a position corresponding to the step and the stiffness coefficient Ki of the jig 12 is as follows:

$$Ki = \frac{E \cdot Di}{Li} \rightarrow \text{Equation 4}.$$

By combining Equations 3 and 4, it can be obtained that:

$$Li = \frac{H \cdot E \cdot Di \cdot \cos \alpha i}{Fi}.$$

The thickness of the jig 12 at a position corresponding to the step may be a maximum thickness of the jig 12 at positions corresponding to the steps, or may be a minimum thickness of the jig 12 at positions corresponding to the steps.

In addition, for example, as shown in FIG. 7, the distance between the first surface M1 and the second surface M2 is variable in the bent section Q1. In this case, Li may be equal to d(Li), and d(Li) represents a differentiation of a function corresponding to Li at a corresponding step, for example, d(Li) can be approximately equal to an average thickness of the jig 12 at positions corresponding to the steps.

The embodiments in the present disclosure do not limit this, as long as the positive pressure received by the object is within an acceptable range and the lamination will not be incomplete due to a too small positive pressure.

In addition, the number of steps in the bent section Q1 is not limited, as long as a vertical distance between the step and the first surface causes the positive pressure on the object to be in a range of: 0.3 MPA≤Fi≤0.9 MPA.

For example, areas of orthographic projections of the steps on the second reference plane may all be the same; or, the areas of the orthographic projections of the steps on the second reference plane may all be different; or, areas of orthographic projections of some of the steps on the second reference plane are the same, and areas of orthographic projections of other steps on the second reference plane are different.

Based on the above, it can be known from the equation $$Li = \frac{H \cdot E \cdot Di \cdot \cos \alpha i}{Fi}$$

that in the embodiments of the present disclosure, in a case where the thickness Li of the jig 12 at a position corresponding to a step is constant, the positive pressure Fi on the object can be adjusted by adjusting the number of the multiple steps and/or by adjusting the areas of the orthographic projections of respective steps on the second reference plane. It will be noted that, in a case where the thickness of the jig 12 at the position corresponding to the step is constant, the larger the number of steps, the smaller the area of the orthographic projection of the step on the second reference plane, and in this way, the positive pressure Fi on the object can be adjusted. In addition, the more steps, the smaller the difference between the positive pressures Fi exerted on two portions of the object at positions corresponding to two adjacent steps. In this case, the object is not easy to be fractured.

Or, in the embodiments of the present disclosure, both the thickness Li of the jig 12 at a position corresponding to each step and the number of the steps (and/or, adjusting the areas of the orthographic projections of respective steps on the second reference plane) may be adjusted to adjust the thicknesses of the jig 12 at positions corresponding to respective steps, so as to adjust the positive pressure Fi on the object.

In the embodiments of the present disclosure, a portion of the second surface located in the bent section is arranged to be in a shape of steps, and according to the equation $$Li = \frac{H \cdot E \cdot Di \cdot \cos \alpha i}{Fi},$$

the thickness Li of the jig 12 at a position corresponding to a step is adjusted, so as to adjust the positive pressure Fi on the object. In a case where the object 4 includes an array substrate 41 and a counter substrate 42 aligned in cell, and a light-transmitting cover plate 44, since a maximum positive pressure that the array substrate 41 and the counter substrate 42 aligned in cell can withstand is 0.9 MPA, the positive pressure Fi on the object must meet Fi≤0.9 Mpa, so as to avoid cracks in the array substrate 41 and the counter substrate 42 aligned in cell and the light-transmitting cover plate 44 during lamination. Meanwhile, the positive pressure Fi on the object must meet Fi≥0.3 Mpa, so as to avoid a problem that the array substrate 41 and the counter substrate 42 aligned in cell and the light-transmitting cover plate 44 are not firmly laminated due to bubbles caused by an insufficient positive pressure on the array substrate 41 and the counter substrate 42 aligned in cell and the light-transmitting cover plate 44.

For example, as shown in FIG. 5, the first surface M1 is arch-shaped.

Herein, since the object 4 is in direct contact with the first surface M1 and completely bonded thereto, the object 4 is also arch-shaped.

In the embodiments of the present disclosure, arch-shaped objects are widely used, and the above method can be used to adjust the positive pressure on the arch-shaped object, so as to avoid a problem that the arch-shaped object cracks or is not firmly laminated.

For example, as shown in FIG. 6, the laminating apparatus 10 further has a non-bent section Q2. A portion of the first surface M1 located in the non-bent section Q2 (for example, a flat surface 123) and a portion of the second surface M2 located in the non-bent section Q2 are both flat surfaces parallel to the horizontal plane.

It will be noted that FIG. 6 only shows a case where the non-bent section Q2 is adjacent to two bent sections Q1, but the embodiments of the present disclosure do not limit positions of the bent section Q1 and the non-bent section Q2, and a positional relationship between the two can be arbitrary, as long as the portion of the first surface located in the non-bent section Q2 and the portion of the first surface located in the bent section Q1 are an integral structure.

Herein, since the object 4 is in direct contact with the first surface M1 and completely bonded thereto, the surface of the object 4 proximate to the jig 12 also includes a flat surface, which is attached to the portion of the first surface M1 located in the non-bent section Q2 (for example, the flat surface 123).

In the embodiments of the present disclosure, with an OLED display apparatus as an example, a display surface of the OLED display apparatus mostly includes both cambered surface(s) and flat surface(s). In the embodiments of the present disclosure, the above method can be used to adjust the positive pressure on the object including cambered surface(s) and flat surface(s), so as to avoid a problem that the laminating object including cambered surface(s) and flat surface(s) cracks or is not firmly laminated.

In some embodiments of the present disclosure, as shown in FIG. 6, the first surface M1 of the jig 12 includes a first segment of sub-cambered surface 121 and a second segment of sub-cambered surface 122, and the first segment of sub-cambered surface 121 is mirror symmetrical to the second segment of sub-cambered surface 122. The flat surface 123 of the first surface is disposed between the first segment of sub-cambered surface 121 and the second segment of sub-cambered surface 122, and is directly connected with the first segment of sub-cambered surface 121 and the second segment of sub-cambered surface 122 respectively. An intersection line of the first segment of sub-cambered surface 121 and the flat surface 123 is a first intersection line. A non-obtuse angle θi between a tangent of first segment of sub-cambered surface 121 and the horizontal direction increases gradually from the first intersection line to an end of the first segment of sub-cambered surface 121 opposite to the first intersection line.

It will be noted that, since the second segment of sub-cambered surface 122 is mirror symmetrical to the first segment of sub-cambered surface 121, a shape of the second segment of sub-cambered surface 122 is exactly the same as a shape of the first segment of sub-cambered surface 121. In a case where the non-obtuse angle θi between the tangent of the first segment of sub-cambered surface 121 and the horizontal direction increases gradually from the first intersection line to the end of the first segment of sub-cambered surface 121 opposite to the first intersection line, the second segment of sub-cambered surface 122 includes a second intersection line at which the second segment of sub-cambered surface intersects the flat surface 123, and a non-obtuse angle θi between a tangent of the second segment of sub-cambered surface 122 and the horizontal direction also increases gradually from the second intersection line to an end of the second segment of sub-cambered surface 122 opposite to the second intersection line.

At present, most curved OLED display apparatuses (such as curved mobile phones) have mirror-symmetrical cambered surfaces on left and right sides, and a surface between the mirror-symmetrical cambered surfaces is flat. Therefore, the laminating apparatus 10 provided in the embodiments of the present disclosure can be applied to most curved OLED display apparatuses, and the above method can be used to adjust the positive pressure Fi on a curved display apparatus in such shape, so as to avoid a problem that an object in such shape cracks or is not firmly laminated.

For example, as shown in FIG. 6, a thickness of the portion of the jig 12 located in the non-bent section Q2 is greater than a thickness of the portion of the jig 12 located in the bent section Q1.

That is, a stiffness coefficient of the portion of the jig 12 located in the non-bent section Q2 is smaller than that of the portion of the jig 12 located in the bent section Q1. That is, a hardness of the portion of the jig 12 located in the non-bent section Q2 is less than a hardness of the portion of the jig 12 located in the bent section Q1.

For example, the hardness of the portion of the jig 12 located in the non-bent section Q2 is less than the hardness of the portion of the jig 12 located in the bent section Q1.

In an example where the material of the jig 12 is silicone, the hardness of the jig 12 at different positions can be adjusted by adjusting an amount of silicone, so that the hardness of the material of the jig 12 is different at different positions.

In the embodiments of the present disclosure, it can be known from the foregoing analysis that, in a case where the positive pressure on the cambered surface is constant, the larger the non-obtuse angle θi between the tangent of the first surface and the horizontal direction, the larger the distance between the second surface and the first reference plane, the smaller the thickness of the jig 12, and the larger the stiffness coefficient of the jig 12. Therefore, the magnitude of the positive pressure Fi on the object can be adjusted by changing the thickness of the jig 12. Since the angle between the tangent direction of the flat surface 123 and the horizontal direction is 0°, the thickness of the portion of the jig 12 corresponding to the flat surface 123 (the portion located in the non-bent section Q2) is greater than the thickness of the portion of the jig 12 corresponding to the cambered surface (the portion located in the bent section Q1).

The embodiments of the present disclosure further provides an assembling method of a flexible display panel, which can be achieved by the following steps S11 and S12, as shown in FIGS. 5, 6, and 9.

In S11, an array substrate 41 and a counter substrate 42 aligned in cell, a transparent adhesive layer 43, and a light-transmitting cover plate 44 are placed in sequence on a first surface of the laminating apparatus as described in any of the above embodiments. A surface of the array substrate 41 away from the light-transmitting cover plate 44 is in contact with and bonded to the first surface.

Herein, the array substrate 41 and the counter substrate 42 aligned in cell, the transparent adhesive layer 43, and the light-transmitting cover plate 44 can be placed on the first surface by a clamp.

It will be noted that, firstly, a material of the light-transmitting cover plate 44 is not limited, as long as a hardness of the light-transmitting cover plate 44 is large enough and the light-transmitting cover plate 44 is light-transmissive.

For example, the light-transmitting cover plate 44 is of glass, such as organic glass.

Secondly, a material of the transparent adhesive layer 43 is not limited. For example, the material of the transparent adhesive layer 43 includes an optically clear adhesive (OCA).

In S12, the laminating apparatus exerts a force on the array substrate 41 and the counter substrate 42 aligned in cell, the transparent adhesive layer 43, and the light-transmitting cover plate 44, until the array substrate 41 and the counter substrate 42 aligned in cell, the transparent adhesive layer 43, and the light-transmitting cover plate 44 are laminated together.

Herein, a hydraulic column 14 can be used to exert the force on a rigid substrate 11. After being subjected to the force Fi exerted by the laminating apparatus, the rigid substrate 11, the jig 12, the array substrate 41 and the counter substrate 42 aligned in cell, the transparent adhesive layer 43, and the light-transmitting cover plate 44 will move in a direction from the rigid substrate 11 toward the fixed plate 13, until a surface of the light-transmitting cover plate 44 facing away from the array substrate 41 is in contact with the fixed plate 13. After that, the hydraulic column 14 is used to exert a force on the rigid substrate 11, until the array substrate 41 and the counter substrate 42 aligned in cell, the transparent adhesive layer 43, and the light-transmitting cover plate 44 are laminated together.

After being squeezed, the rigid substrate 11 transmits the force to the jig 12, and then the jig 12 exerts the positive pressure to the array substrate 41 and the counter substrate 42 aligned in cell, the transparent adhesive layer 43, and the light-transmitting cover plate 44.

The force exerted by the laminating apparatus on the array substrate 41 and the counter substrate 42 aligned in cell, the transparent adhesive layer 43, and the light-transmitting cover plate 44 may be in any direction, as long as the force makes the array substrate 41 and the counter substrate 42 aligned in cell, the transparent adhesive layer 43, and the light-transmitting cover plate 44 move in the direction from the rigid substrate 11 to the fixed plate 13.

The flexible display panel can be in any shape, as long as the flexible display panel can be in contact with and bonded to the first surface of the jig 12.

The flexible display panel can be any type of flexible display panel. For example, the flexible display panel is an OLED display panel.

The embodiments of the present disclosure further provides an assembling method of a flexible display panel, which has the same technical effects as those of the laminating apparatus described above, and details will not be repeated here.

Optionally, after the array substrate 41 and the counter substrate 42 aligned in cell, the transparent adhesive layer 43, and the light-transmitting cover plate 44 are laminated together, the assembling method of the flexible display panel further includes: separating the laminating apparatus from the flexible display panel.

In the embodiments of the present disclosure, when the laminating apparatus 10 is used to laminate the array substrate 41 and the counter substrate 42 aligned in cell, the transparent adhesive layer 43, and the light-transmitting cover plate 44 are laminated, the laminating apparatus 10 is coupled with the array substrate 41 and the counter substrate 42 aligned in cell, the transparent adhesive layer 43, and the light-transmitting cover plate 44. The laminating apparatus 10 can be separated from the flexible display panel after the array substrate 41 and the counter substrate 42 aligned in cell, the transparent adhesive layer 43, and the light-transmitting cover plate 44 are laminated together.

The embodiments of the present disclosure further provide a flexible display panel, which is manufactured by the assembling method of the flexible display panel described in any of the above embodiments.

For example, the flexible display panel may be an OLED display panel. The purpose and structure of the OLED display panel are the same as those of the OLED display panel 21 shown in FIG. 1, and details are not repeated here.

The flexible display panel provided in the embodiments of the present disclosure has the same technical effects as those of the laminating apparatus described above, and details are not repeated here.

The embodiments of the present disclosure further provide a flexible display apparatus, which includes the flexible display panel described in any of the above embodiments.

For example, the flexible display apparatus may be an OLED display apparatus. The purpose and structure of the OLED display apparatus are the same as those of the OLED display apparatus 00 shown in FIG. 1, and details are not repeated here.

The flexible display apparatus provided in the embodiments of this present disclosure has the same technical effects as those of the laminating apparatus described above, and details are not repeated here.

The forgoing descriptions are merely specific implementations of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A laminating apparatus for laminating an object to be laminated, wherein the laminating apparatus comprises:
    a rigid substrate; and
    a jig provided on a side of the rigid substrate and in contact therewith, the jig being of an elastic material, and a surface of the jig away from the rigid substrate being a first surface; wherein
    the laminating apparatus has a bent section, and a portion of the first surface located in the bent section includes at least one segment of cambered surface; a non-obtuse angle between a tangent of any one of the at least one segment of cambered surface and a horizontal direction increases gradually from an end of the segment of cambered surface to an opposite end of the segment of cambered surface;
    a horizontal plane at any point in a surface of the rigid substrate away from the jig is a first reference plane, and a contact interface between the rigid substrate and the jig is a second surface;
    for any one of the at least one segment of cambered surface, a distance between the second surface and the first reference plane increases as the non-obtuse angle between the tangent of the first surface and the horizontal direction increases; and
    a portion of the second surface located in the bent section is in a shape of multiple steps; and a thickness of the jig corresponding to a step is:

$$Li = \frac{H \cdot E \cdot Di \cdot \cos \alpha i}{Fi};$$

wherein Fi represents a force exerted by the laminating apparatus on the object in the normal direction of the first surface and meets 0.3 Mpa≤Fi≤0.9 Mpa; H represents a displacement of a surface of the object proximate to the jig relative to a surface of the object away from the jig; E represents an elastic modulus of the jig; Di represents an area of an orthographic projection of a surface of the step on a second reference plane, the surface of the step being perpendicular to the direction in which the rigid substrate exerts the force on the jig, and the second reference plane being perpendicular to the direction in which rigid substrate exerts the force on the jig; and αi represents an angle between the direction in which the rigid substrate exerts the force on the jig and the normal direction of the first surface, and meets 0°≤αi≤90°.

2. The laminating apparatus according to claim 1, wherein a positive pressure Fi exerted by the laminating apparatus on the object to be laminated in a normal direction of the first surface satisfies following equation:

$$Fi = fi \cdot \cos \alpha i;$$

wherein fi represents a force exerted on the jig by the rigid substrate, and αi represents an angle between a direction in which the rigid substrate exerts the force on the jig and the normal direction of the first surface.

3. The laminating apparatus according to claim 1, wherein for any one of the at least one segment of cambered surface, directions in which the rigid substrate exerts the force on the jig at various positions are the same.

4. The laminating apparatus according to claim 1, wherein the laminating apparatus further has a non-bent section, and a portion of the first surface located in the non-bent section and a portion of the second surface located in the non-bent section are both flat surfaces parallel to the horizontal plane.

5. The laminating apparatus according to claim 4, wherein the at least one segment of cambered surface includes a first segment of sub-cambered surface and a second segment of sub-cambered surface, the first segment of sub-cambered surface being mirror symmetrical to the second segment of sub-cambered surface, a flat surface in the first surface being disposed between the first segment of sub-cambered surface and the second segment of sub-cambered surface, and being directly connected with the first segment of sub-cambered surface and the second segment of sub-cambered surface respectively;
    wherein an intersection line of the first segment of sub-cambered surface and the flat surface is a first intersection line, and a non-obtuse angle between a tangent of the first segment of sub-cambered surface and the horizontal direction increases gradually from the first intersection line to an end of the first segment of sub-cambered surface opposite to the first intersection line.

6. The laminating apparatus according to claim 5, wherein a thickness of a portion of the jig located in the non-bent section is greater than a thickness of a portion of the jig located in the bent section.

7. The laminating apparatus according to claim 4, wherein a hardness of the portion of the jig located in the non-bent section is less than a hardness of the portion of the jig located in the bent section.

8. The laminating apparatus according to claim 1, wherein the jig bulges from a side thereof away from the rigid substrate.

9. The laminating apparatus according to claim 1, wherein the first surface is arch-shaped.

10. The laminating apparatus according to claim 1, wherein the direction in which the rigid substrate exerts the force on the jig is a vertical direction.

11. The laminating apparatus according to claim 1, wherein the surface of the rigid substrate away from the jig is flat.

12. The laminating apparatus according to claim 1, wherein
    the elastic material of the jig includes a hyperelastic material.

13. The laminating apparatus according to claim 1, wherein
    the jig is of at least one of silicone or rubber.

14. The laminating apparatus according to claim 1, wherein
    the rigid substrate is of at least one of glass or metal.

15. An assembling method of a flexible display panel, comprising:

placing an array substrate and a counter substrate aligned in cell, a transparent adhesive layer and a light-transmitting cover plate in sequence on a first surface of the laminating apparatus according to claim 1, a surface of the array substrate away from the light-transmitting cover plate being in contact with and bonded to the first surface; and exerting, by the laminating apparatus, a force on the array substrate and the counter substrate aligned in cell, the transparent adhesive layer, and the light-transmitting cover plate, until the array substrate and the counter substrate aligned in cell, the transparent adhesive layer, and the light-transmitting cover plate are laminated together.

* * * * *

UNITED STATES PATENT AND TRADEMARK OFFICE
CERTIFICATE OF CORRECTION

| | | |
|---|---|---|
| PATENT NO. | : 11,745,489 B2 | Page 1 of 1 |
| APPLICATION NO. | : 17/056376 | |
| DATED | : September 5, 2023 | |
| INVENTOR(S) | : Xingguo Liu and Wei Qing | |

It is certified that error appears in the above-identified patent and that said Letters Patent is hereby corrected as shown below:

In the Claims

Column 18 Line 39 should read:
6. The laminating apparatus according to claim 4, wherein a thickness of a portion of the jig located in the non-bent section is greater than a thickness of a portion of the jig located in the bent section.

Signed and Sealed this
Nineteenth Day of March, 2024

Katherine Kelly Vidal
*Director of the United States Patent and Trademark Office*